United States Patent
Motojima

(10) Patent No.: US 8,143,725 B2
(45) Date of Patent: Mar. 27, 2012

(54) SEMICONDUCTOR DEVICE

(75) Inventor: Dai Motojima, Kyoto (JP)

(73) Assignee: Panasonic Corporation, Osaka (JP)

( * ) Notice: Subject to any disclaimer, the term of this patent is extended or adjusted under 35 U.S.C. 154(b) by 158 days.

(21) Appl. No.: 12/650,733

(22) Filed: Dec. 31, 2009

(65) Prior Publication Data

US 2010/0133690 A1 Jun. 3, 2010

Related U.S. Application Data

(63) Continuation of application No. PCT/JP2009/000712, filed on Feb. 19, 2009.

(30) Foreign Application Priority Data

Jun. 6, 2008 (JP) ................................. 2008-149554

(51) Int. Cl.
H01L 29/40 (2006.01)
(52) U.S. Cl. ........ 257/774; 257/773; 257/775; 257/776; 257/E23.143; 257/E23.145
(58) Field of Classification Search .................. 257/751, 257/773–776, E23.143, 145
See application file for complete search history.

(56) References Cited

U.S. PATENT DOCUMENTS

| 5,831,219 A | 11/1998 | Kobayashi et al. |
| 2003/0080433 A1 | 5/2003 | Hanaoka et al. |
| 2004/0065961 A1 | 4/2004 | Funakoshi et al. |
| 2007/0158835 A1* | 7/2007 | Lin et al. ........................ 257/734 |
| 2008/0179084 A1 | 7/2008 | Sato |

FOREIGN PATENT DOCUMENTS

| JP | 08-139182 | 5/1996 |
| JP | 09-055423 | 2/1997 |
| JP | 10-214893 | 8/1998 |
| JP | 2003-133312 | 5/2003 |
| JP | 2003-218115 | 7/2003 |
| JP | 2005-209979 | 8/2005 |
| JP | 2007-165750 | 6/2007 |

OTHER PUBLICATIONS

Japanese Office Action, with English translation, issued in Japanese Patent Application No. 2008-149554, mailed Jul. 6, 2010.
Japanese Decision of Rejection, w/ English translation thereof, issued in Japanese Patent Application No. JP 2008-149554 dated Sep. 14, 2010.

* cited by examiner

*Primary Examiner* — Minchul Yang
(74) *Attorney, Agent, or Firm* — McDermott Will & Emery LLP

(57) ABSTRACT

A semiconductor device includes a first interconnect 31; a second interconnect 32 which is formed in a different interconnect layer from that of the first interconnect 31, and which has a wider line width than that of the first interconnect 31; and first and second plugs 51 and 52 which are formed in a region where the first and second interconnects 31 and 32 extend in the same direction so as to overlap one above the other, and which electrically connect the first and second interconnects 31 and 32. The first plug 51 has a larger base area than that of the second plug 52, and is formed on an end side of the first interconnect 31 with respect to the second plug 52.

18 Claims, 8 Drawing Sheets

FIG. 2
(a)
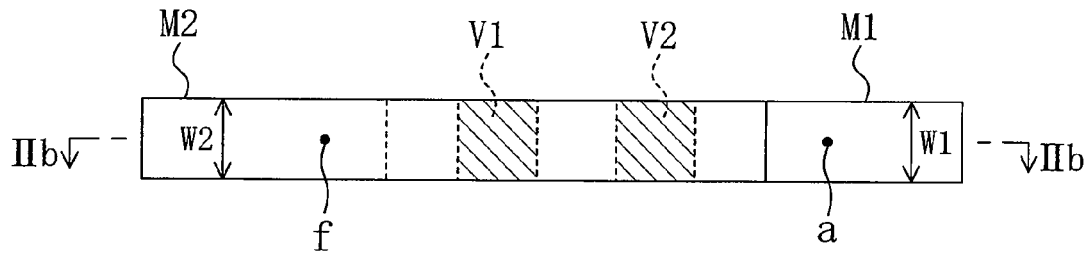
(b)
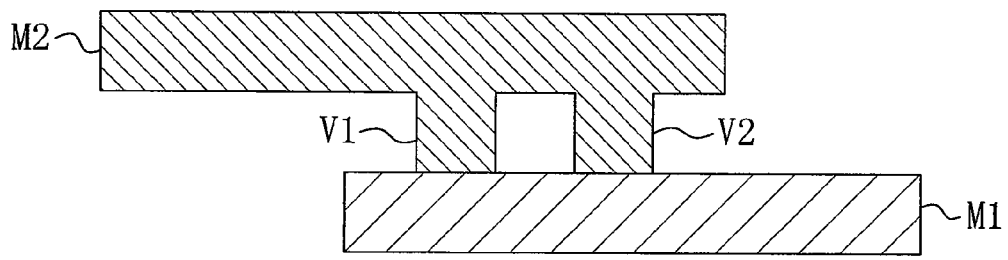
(c)
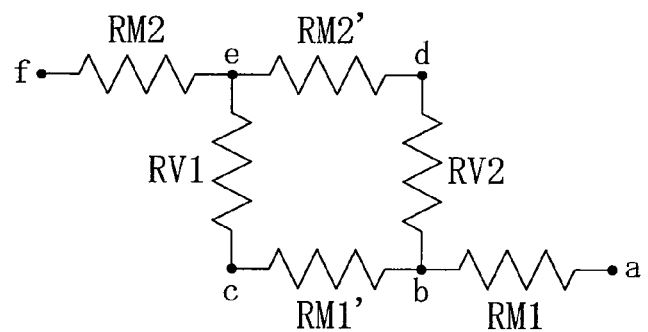

FIG. 3
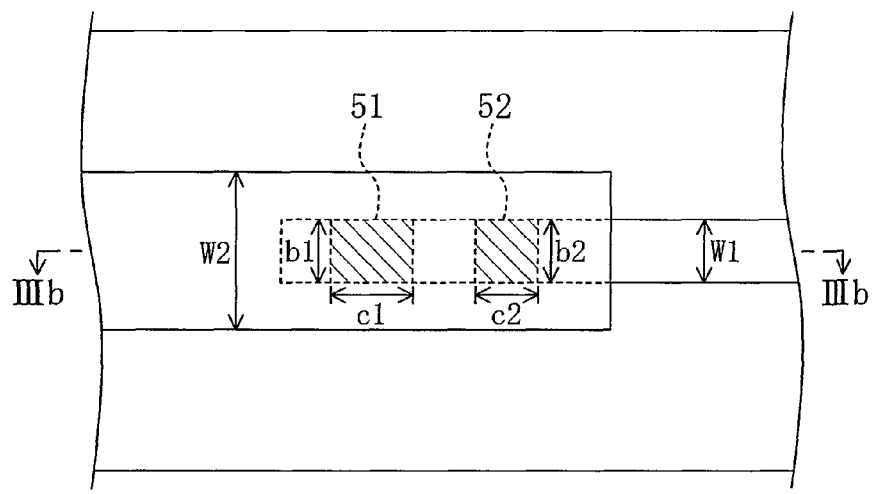
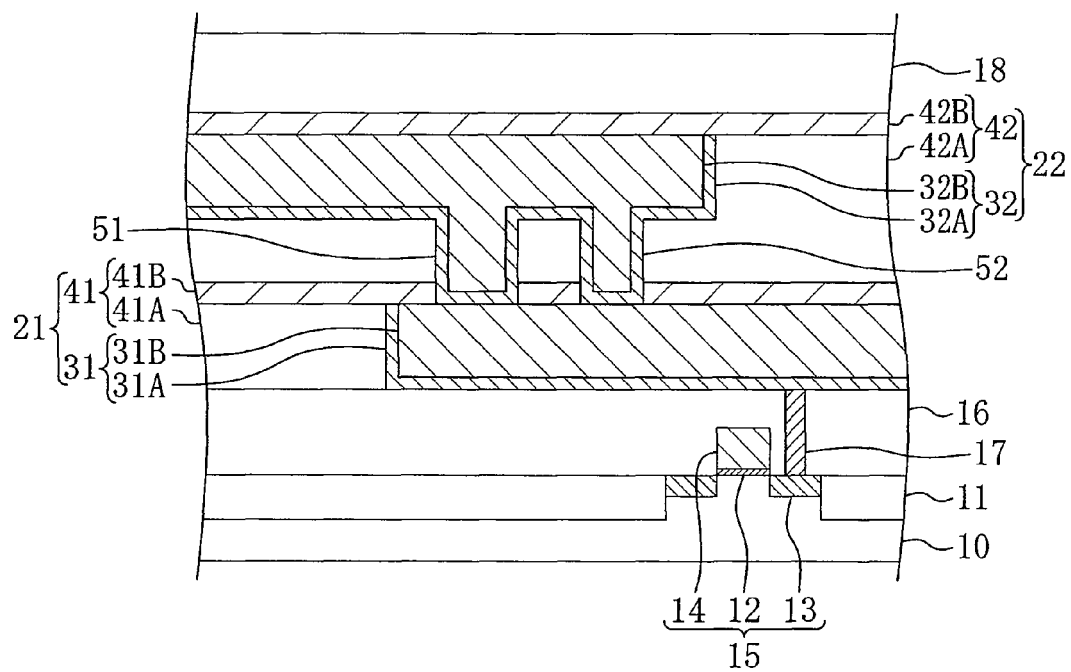

FIG. 5
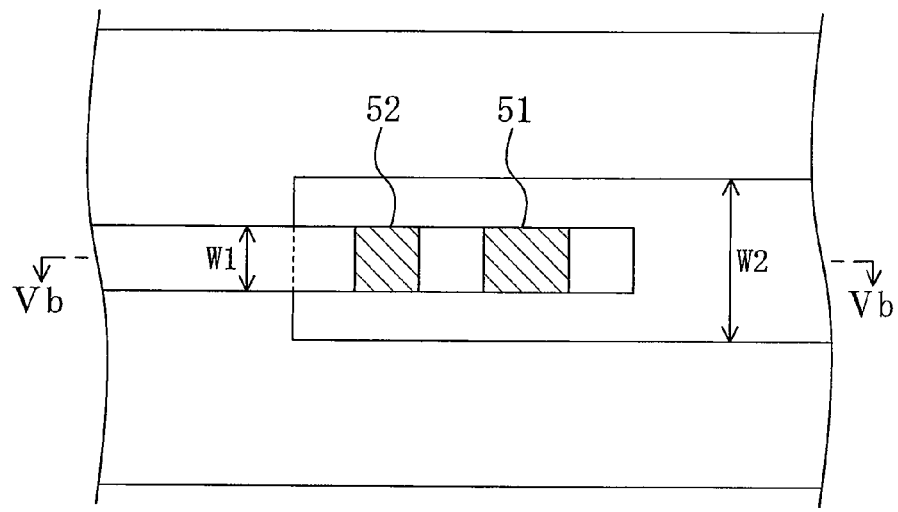
(a)
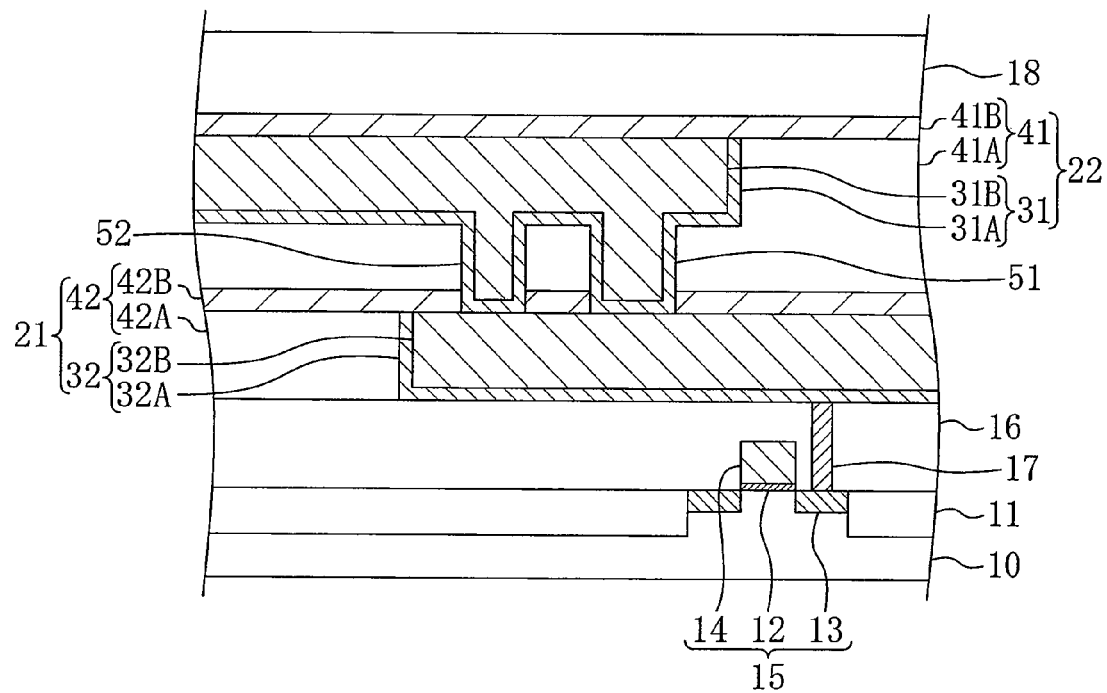
(b)

FIG. 6
(a)
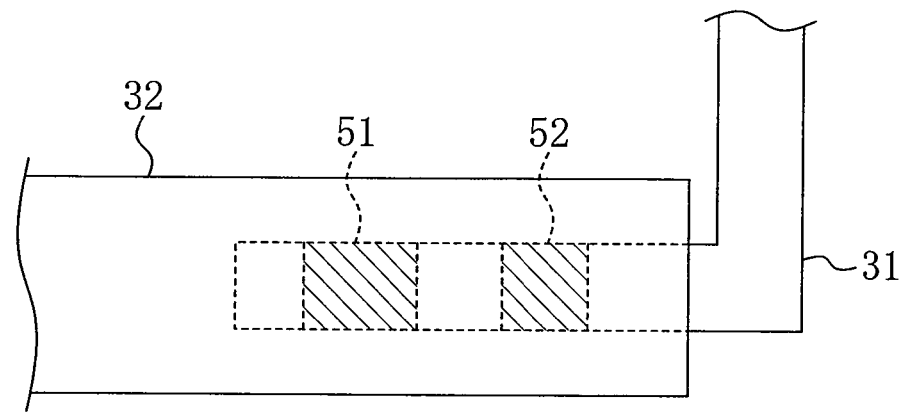
(b)
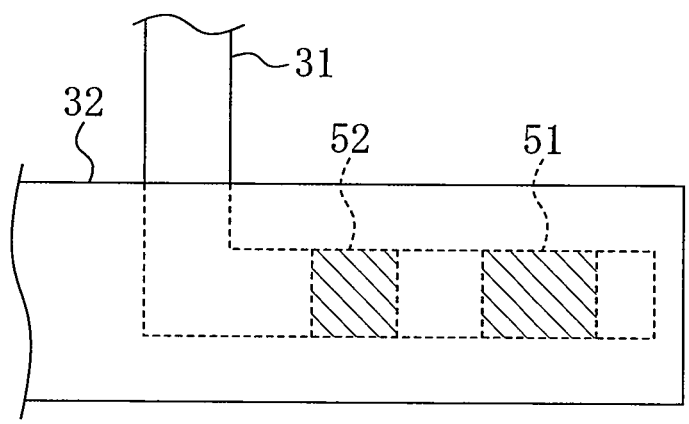

FIG. 8
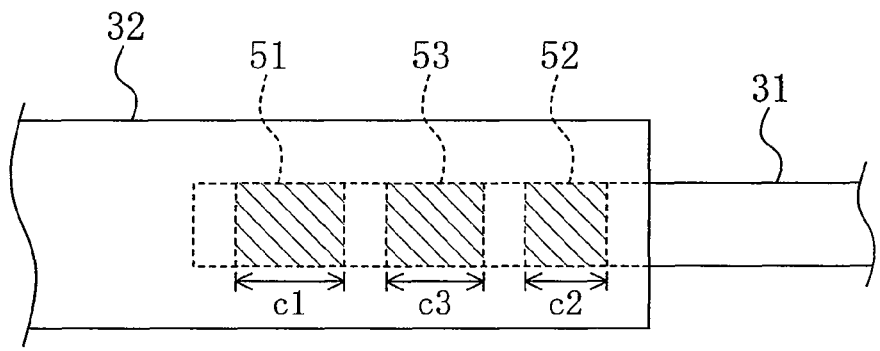
FIG. 9
PRIOR ART
(a)
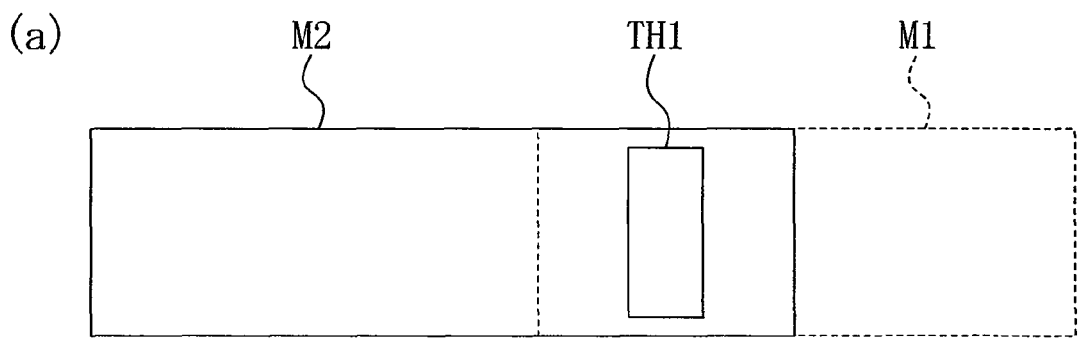
(b)
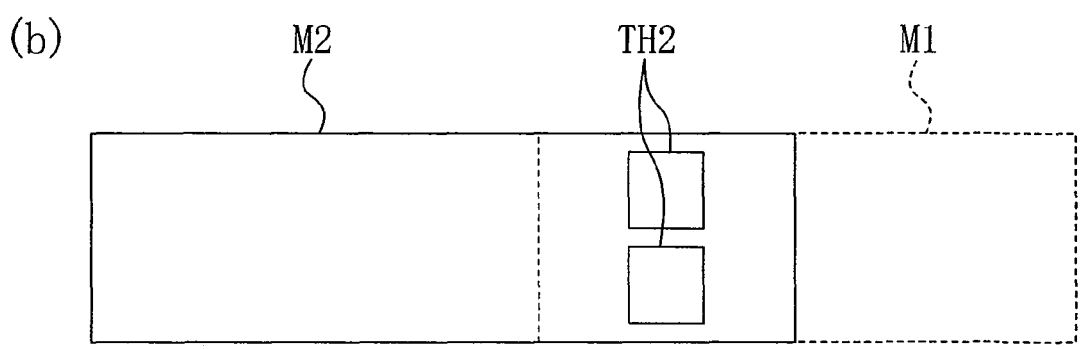

SEMICONDUCTOR DEVICE

CROSS-REFERENCE TO RELATED APPLICATION

This is a continuation of PCT International Application PCT/JP2009/000712 filed on Feb. 19, 2009, which claims priority to Japanese Patent Application No. 2008-149554 filed on Jun. 6, 2008. The disclosures of these applications including the specifications, the drawings, and the claims are hereby incorporated by reference in its entirety.

BACKGROUND

The present disclosure relates to a semiconductor device, and particularly relates to a semiconductor device including a plurality of interconnects electrically connected to each other by plugs.

For speed-up and high-integration of semiconductor devices, miniaturization and multi-layering of interconnects have been promoted with miniaturization of semiconductor active elements. The miniaturization and multi-layering of interconnects have caused reliability reduction due to electromigration (EM). The term "EM" is a movement of metal atoms constituting an interconnect by a flow of electrons in interconnect material, resulting in causing air gaps in the interconnect. This causes an increase in interconnect resistance, and, in the worst case, causes interconnect disconnection.

Interconnect material mainly formed of copper is used for recent semiconductor devices. Copper has a lower resistance and a higher melting point than those of aluminum. Consequently, the interconnect resistance can be reduced while improving EM resistance.

Copper interconnects are generally formed by a damascene process in which copper is embedded in a groove formed in an interlayer film, by an electro chemical deposition. Particularly, a dual damascene process has been widely used, in which an interconnect and an interlayer interconnect (plug) for connecting the interconnect to an interconnect of a lower layer are simultaneously formed.

Copper has a large diffusion coefficient with respect to an interlayer film mainly formed of silicon dioxide. For this reason, copper interconnects generally have a laminated structure of a barrier film for preventing copper diffusion, and an interconnect material film made of copper. Hence, there is the barrier film at an interface between the plug integrally formed with the interconnect of the upper layer by the dual damascene process, and the interconnect of the lower layer. That is, copper atoms constituting the interconnect of the upper layer and the plug are physically separated from copper atoms constituting the interconnect of the lower layer by the barrier film made of a different type of material. Consequently, a flow of the copper atoms due to EM is discontinuous at an interface between the plug and the interconnect of the lower layer.

When electrons move from the interconnect of the upper layer to the interconnect of the lower layer through the plug, a supply of the copper atoms to the interconnect of the lower layer is obstructed by the barrier film, and thereby causing a loss of the copper atoms due to EM in a portion of the interconnect of the lower layer, which contacts the plug. On the other hand, when electrons move from the interconnect of the lower layer to the interconnect of the upper layer through the plug, a supply of the copper atoms to the plug is obstructed by the barrier film, and thereby causing the loss of the copper atoms due to EM in a bottom portion of the plug. Such a copper atom loss results in an increase in interconnect resistance, and, in the worst case, results in interconnect disconnection.

Generally, a flow J(EM) of interconnect material atoms due to EM is proportional to a current density j flowing in the interconnect, and is represented by the following expression (1):

$$J(EM) = N \times (D/kT) \times Z^* \times e \times \rho \times j \quad (1)$$

where the parameter "N" represents an atomic density; the parameter "D" represents a diffusion coefficient; the parameter "k" represents a Boltzmann constant; the parameter "T" represents an absolute temperature; the parameter "Z*" represents the effective charge number of the interconnect material atoms; the parameter "e" represents an elementary charge; the parameter "ρ" represents a resistivity; and the parameter "j" represents the current density.

That is, the movement of the atoms due to EM is proportional to the current density of the interconnects and plug, and therefore it is required for EM suppression to lower the current density of the interconnects and plug. In order to lower the current density of the interconnects and plug, methods in which a shape of the plug is changed, or in which the number of plugs is increased have been attempted (see, e.g., Japanese Patent Publication No. 10-214893). For example, a plug TH1 connecting a lower layer interconnect M1 to an upper layer interconnect M2 as illustrated in FIG. 9(a) is formed so as to have a rectangular bottom surface, a width Y of which is longer than a length X. In comparison to a case that the plug TH1 has a square bottom surface, this allows a current flowing into the plug TH1 to disperse. Consequently, this prevents the current density from being locally high at the periphery of the plug TH1, and thereby improving the EM resistance.

In addition, as illustrated in FIG. 9(b), two plugs TH2 connect the lower layer interconnect M1 to the upper layer interconnect M2, and are arranged along a direction perpendicular to a direction in which a current flows in the two plugs TH2. This prevents the current density from being locally high at the periphery of the plugs TH2, and thereby improving the EM resistance.

SUMMARY

However, there is a problem in which the conventional method for improving the EM resistance cannot be applicable to an interconnect having a narrow line width. If the line width of the interconnect is sufficiently wider than a width of a plug, the current flowing in the plug can be dispersed by the conventional method. However, as the reduction of the line width is developed, it is generally that a minimum design dimension of the interconnect is equal to a minimum design dimension of the plug. For this reason, the width of the plug is determined depending on the line width of the interconnect. This results in having a smaller base area in the case of the plug formed with the rectangular bottom surface than that in the case of the plug formed with the square bottom surface, and thereby increasing the current density.

When the line width of the interconnect becomes narrower, it is impossible to arrange a plurality of plugs along the direction perpendicular to the direction in which the current flows. On the other hand, the present inventors have discovered that, if a plurality of plugs are simply arranged along the direction in which the current flows, a problem is caused, in which the current is concentrated on one of the plugs.

Such a problem is particularly exacerbated in semiconductor devices in which the minimum design dimension of the interconnect width is the same as that of the plug. However, even if the minimum design dimension of the interconnect width is not the same as that of the plug, the problem may be caused with the miniaturization of the interconnect.

It is an object of the present disclosure to, in the semiconductor device having the miniaturized interconnects, effectively disperse the current flowing in the plugs connected between the interconnect of the upper layer and the interconnect of the lower layer, and thereby realizing a semiconductor device having the excellent electromigration resistance.

In order to accomplish such an object, the semiconductor device of the present disclosure is configured so as to include a plurality of plugs for connecting two interconnects, and to have different base areas of the plugs.

In particular, the semiconductor device of the present disclosure includes a first interconnect; a second interconnect which is formed in a different interconnect layer from that of the first interconnect, and which has a wider line width than that of the first interconnect; and first and second plugs which are formed in a region where the first and second interconnects extend in the same direction so as to overlap one above the other, and which electrically connect the first and second interconnects. The first plug has a larger base area than that of the second plug, and is formed on an end side of the first interconnect with respect to the second plug. The term "end side" means a side which is not electrically connected to other interconnect arranged in the same interconnect layer as that of the first interconnect, or to other interconnect arranged in a different interconnect layer from that of the first interconnect.

The semiconductor device of the present disclosure includes the first and second plugs. The first plug has the larger base area than that of the second plug, and is formed on the end side of the first interconnect with respect to the second plug. Consequently, if the line width of the first interconnect is narrower than that of the second interconnect, a difference between a resistance of a path of a current flowing in the first plug, and a resistance of a path of a current flowing in the second plug can be decreased. Hence, a current concentration on one plug is prevented, and thereby reducing a degradation of interconnects and plugs due to electromigration.

BRIEF DESCRIPTION OF THE DRAWINGS

FIGS. 2(a)-2(c) illustrate a relationship between two interconnects which are connected to each other by two plugs; FIG. 2(a) is a plan view; FIG. 2(b) is an IIb-IIb cross-sectional view of FIG. 2(a); and FIG. 2(c) is an equivalent circuit diagram.

FIGS. 3(a) and 3(b) illustrate a semiconductor device of one embodiment; FIG. 3(a) is a plan view; and FIG. 3(b) is an cross-sectional view of FIG. 3(a).

FIGS. 5(a) and 5(b) illustrate a variation of the semiconductor device of the one embodiment; FIG. 5(a) is a plan view; and FIG. 5(b) is a Vb-Vb cross-sectional view of FIG. 5(a).

FIGS. 6(a) and (b) are plan views illustrating a variation of the semiconductor device of the one embodiment.

FIG. 8 is a plan view illustrating a variation of the semiconductor device of the one embodiment.

FIGS. 9(a) and 9(b) are plan views illustrating a semiconductor device of a conventional example.

DETAILED DESCRIPTION

First, a mechanism for producing a difference in an amount of a current distributed to each plug depending on a difference in widths of upper and lower layer interconnects, which is uniquely discovered by the present inventors, will be explained.

If a line width of an interconnect of a semiconductor device is equal to or less than 100 nm, a mean free path of electrons flowing in interconnect material, and the line width of the interconnect are comparable with each other. In this state, it is known that, due to an occurrence of a scattering at side walls of the interconnect, a mobility of the electrons is degraded, and then interconnect resistance is significantly increased. A mean free path of electrons in a copper interconnect is generally approximately 40-60 nm.

Figure 1:
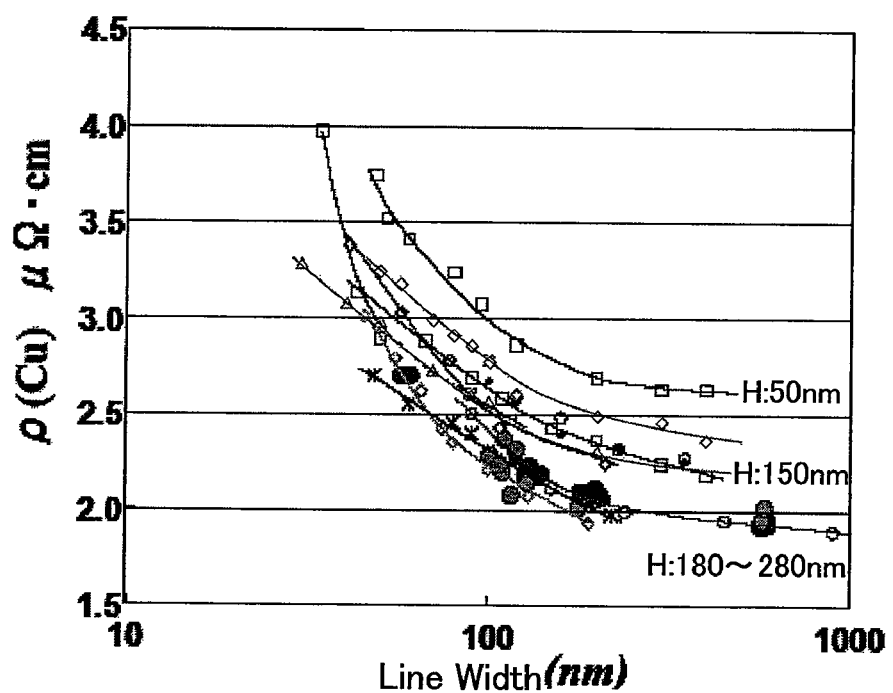
FIG. 1 is a plot illustrating relationships between line widths of an interconnect and resistivity.

FIG. 1 illustrates a result of an evaluation of a relationship between the line width of the interconnect and a resistivity in the copper interconnect. If the line width of the interconnect is equal to or greater than 100 nm, the resistivity of the interconnect is approximately constant regardless of a height H of the interconnect. However, if the line width of the interconnect is equal to or less than 100 nm, the resistivity is dramatically increased. As one example, if the height H of the interconnect is 180-280 nm, the resistivity of the interconnect having the line width of 200 nm is 2.0 μΩcm. On the other hand, the resistivity of the interconnect having the line width of 50 nm is increased to 3.0 μΩcm by approximately 50%. This shows that, if the line width of the interconnect of the semiconductor device is equal to or less than 100 nm, the resistivity of the interconnect is changed depending on the line width of the interconnect.

A case will be considered, in which, as illustrated in FIGS. 2(a) and 2(b), a first interconnect M1 having a line width W1 and a second interconnect M2 having a line width W2 are connected to each other by a first plug V1 and a second plug V2. FIG. 2(a) illustrates a planar structure of the interconnect, and FIG. 2(b) illustrates an IIb-IIb cross-sectional structure of FIG. 2(a). FIG. 2(c) is a structure between a point a of the first interconnect M1 and a point f of the second interconnect M2, which is illustrated in an equivalent circuit diagram. A reference character "RM1" represents a resistance of the first interconnect M1 between the point a and the second plug V2; a reference character "RM1'" represents a resistance of the first interconnect M1 between the second plug V2 and the first plug V1; a reference character "RV2" represents a resistance of the second plug V2; a reference character "RV 1" represents a resistance of the first plug V1; a reference character "RM2'" represents a resistance of the second interconnect M2 between the second plug V2 and the first plug V1; and a reference character "RM2" represents a resistance of the second interconnect M2 between the first plug V1 and the point f.

If the line widths W1 and W2 of the first and second interconnects M1 and M2 are same, or both widths are equal to or greater than 100 nm, resistance values of RM1' and RM2' are approximately the same. In addition, if base areas of the first and second plugs V1 and V2 are same, the resistance values of RV1 and RV2 are same. Consequently, a total resistance value of a path a-b-c-e-f in which a current flows in the first plug V1 is equal to a total resistance value of a path a-b-d-e-f in which a current flows in the second plug V2, and a current flowing between the points a and f is approximately evenly dispersed to two paths. Hence, a density of the current flowing the plugs can be reduced, and thereby improving an EM resistance.

However, if the line width W1 of the first interconnect M1 differs from the line width W2 of the second interconnect M2, and one of them is equal to or less than 100 nm, the resistance value of RM1' differs from the resistance value of RM2'. For example, if an expression W1>W2 is satisfied, it results in an expression RM1'<RM2', and the total resistance value of the path a-b-c-e-f in which the current flows in the first plug V1 is lower than the total resistance value of the path a-b-d-e-f in which the current flows in the second plug V2. Consequently, the current flowing between the points a and f is concentrated on the first plug V1. On the contrary, if an expression W1<W2 is satisfied, it results in an expression RM1'>RM2', and the current is concentrated on the second plug V2. As described above, in the case that the line width W1 of the first interconnect M1 differs from the line width W2 of the second interconnect M2, and one of them is equal to or less than 100 nm, even if the two plugs are formed, a current dispersion effect is small, and the current is concentrated on one of the plugs. In the result, the EM resistance can be barely improved.

Based on the above-described findings, a structure of a semiconductor will be explained hereinafter, in which, even if the line width W1 of the first interconnect M1 differs from the line width W2 of the second interconnect M2, the current is effectively dispersed, and thereby improving the EM resistance.

(One Embodiment)

A semiconductor device of one embodiment will be explained hereinafter with reference to the drawings. FIGS. 3(a) and 3(b) are the semiconductor device of the one embodiment. FIG. 3(a) illustrates a planar structure, and FIG. 3(b) illustrates an IIIb-IIIb cross-sectional structure of FIG. 3(a).

As illustrated in FIGS. 3(a) and 3(b), the semiconductor device includes an active element formed in a substrate 10, and interconnects connected to the active element. FIGS. 3(a) and 3(b) illustrate an example in which the interconnects are copper interconnects, and the active element is a metal insulator semiconductor (MIS) transistor.

A MIS transistor 15 which is the active element includes a gate insulating film 12 and a gate electrode 14 which are formed on an active region surrounded by an element isolation region 11 in the substrate 10; and source drain regions 13 formed on both sides thereof.

A plurality of interconnect layers are formed on the substrate 10 with an insulating film 16 which is formed so as to cover the active element, being interposed therebetween. In FIGS. 3(a) and 3(b), there are two interconnect layers. A lower interconnect layer 21 has a first interconnect 31 and a first interlayer film 41, and an upper interconnect layer 22 has a second interconnect 32 having a wider line width than that of the first interconnect 31, and a second interlayer film 42. A low-dielectric-constant film 18 is formed on the upper interconnect layer 22. However, a further interconnect layer may be formed below the lower interconnect layer 21, or above the upper interconnect layer 22. In addition, other interconnect layer may be formed between the lower interconnect layer 21 and the upper interconnect layer 22.

The first interconnect 31 has a conductive barrier film 31A made of tantalum (Ta), etc., and an interconnect material 31B made of copper (Cu), etc., which are embedded in an interconnect-forming groove formed in the first interlayer film 41, and is connected to a source drain region 13 by a contact 17. The first interlayer film 41 has a low-dielectric-constant film 41A made of silicon oxycarbide (SiOC), etc., and a cap film 41B made of silicon nitride (SiN), etc.

The second interconnect 32 has a conductive barrier film 32A made of Ta, etc., and an interconnect material 32B made of Cu, etc., which are embedded in an interconnect-forming groove formed in the second interlayer film 42, and is connected to the first interconnect 31 of the lower layer by first and second plugs 51 and 52 which are integrally formed. The second interlayer film 42 has a low-dielectric-constant film 42A made of SiOC, etc., and a cap film 42B made of SiN, etc.

The first and second interconnects 31 and 32 extend in the same direction so as to overlap one above the other at least in the region where the first and second plugs 51 and 52 are formed. The line width W1 of the first interconnect 31 is narrower than the line width W2 of the second interconnect 32. The first plug 51 is formed so as to be positioned on an end side of the first interconnect 31 with respect to the second plug 52, and an area of a base (base area) of the first plug 51, which contacts the first interconnect 31, is larger than that of the second plug 52. The term "end side of the first interconnect 31" means a side which, with respect to the first plug 51, is not electrically connected to other interconnect arranged in the same interconnect layer as that of the first interconnect, or to other interconnect arranged in a different interconnect layer from that of the first interconnect.

In FIGS. 3(a) and 3(b), a base shape of the second plug 52 is square, and a width b2 extending in a direction parallel to the line width W1 of the first interconnect 31, and a length c2 extending in a direction intersecting with the line width W1 of the first interconnect 31 are equal to the line width W1 of the first interconnect 31. A base shape of the first plug 51 is rectangular. A width b1 extending in the direction parallel to the line width W1 of the first interconnect 31 is equal to the line width W1 of the first interconnect 31, and a length c1 extending in the direction intersecting with the line width W1 of the first interconnect 31 is longer than the length c2 of the second plug 52. However, the widths b1 and b2 are not necessarily equal to the line width W1 of the first interconnect 31. In addition, the width b2 is not necessarily equal to the length c2.

When the equivalent circuit diagram illustrated in FIG. 2(c) is considered with regard to this structure, expressions RM1'>RM2' and RV1<RV2 are satisfied. Consequently, a difference between a total resistance value of a path in which a current flows in the first plug 51, and a total resistance value of a path in which a current flows in the second plug 52 is less than a difference in a case that RV1 is equal to RV2. Hence, a current concentration on the second plug 52 is reduced, and thereby improving the EM resistance. In particular, if the base areas of the first and second plugs 51 and 52 are designed so as to satisfy an expression RM1'+RV1=RM2'+RV2, the total resistance value of the path in which the current flows in the first plug 51 is equal to the total resistance value of the path in which the current flows in the second plug 52. This most effectively allows the current to disperse, and thereby further improving the EM resistance.

If the total resistance value of the path in which the current flows in the first plug 51 is equal to the total resistance value of the path in which the current flows in the second plug 52, the EM resistance can be maximized. However, a case may be caused, in which, due to limitation of a plug size which can be formed, the expression RM1'+RV1 cannot be equal to the expression RM2'+RV2. Even in this case, the base area of the first plug 51 is made larger than that of the second plug 52, and thereby improving the EM resistance.

Figure 4:
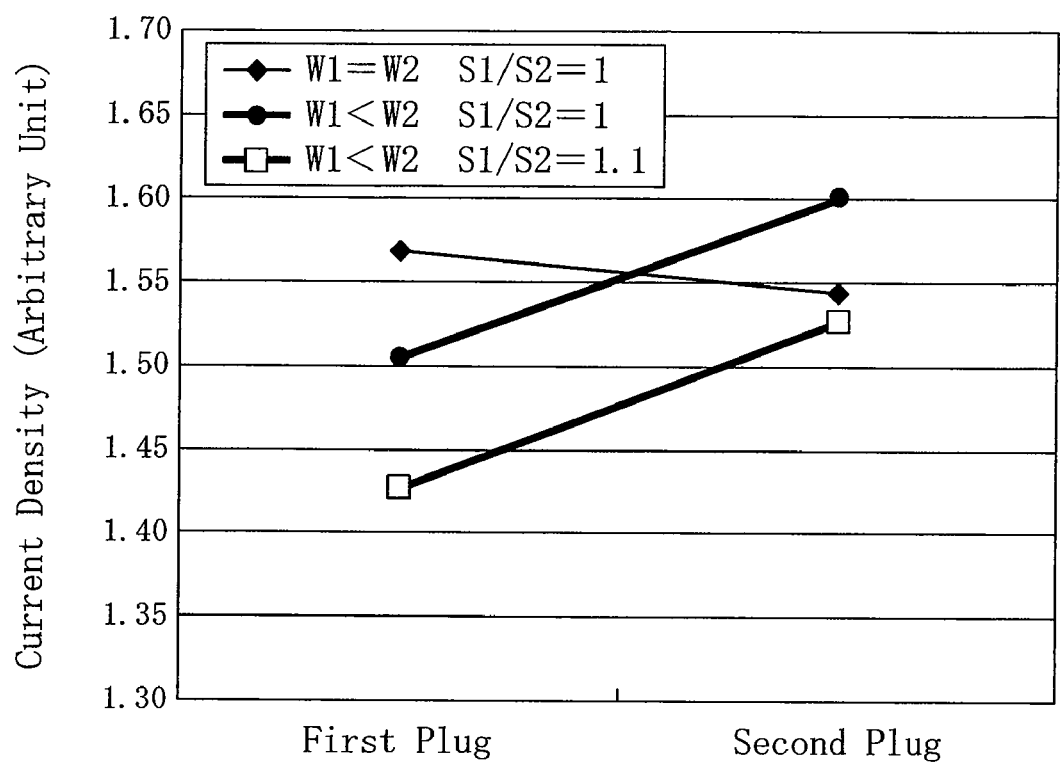
FIG. 4 is a plot illustrating relationships between ratios of a base area of first plug to a base area of a second plug, and current densities.

FIG. 4 illustrates simulated relationships between a ratio of a base area S1 of the first plug 51 to a base area S2 of the second plug 52, and a current density in each plug. In a case that the line width W1 of the first interconnect 31 is equal to the line width W2 of the second interconnect 32, if the ratio of the base areas S1 to S2 is "1," the current density in the first plug 51 is approximately equal to that in the second plug 52. However, in a case that the line width W1 of the first interconnect 31 is narrower than the line width W2 of the second interconnect 32, if the ratio of the base areas S1 to S2 is "1," it is found that the current density in the second plug 52 increases, and thereby causing the current concentration on the second plug 52. On the other hand, in a case that, e.g., the length c1 is made longer than the length c2 by 10% to make the base area S1 of the first plug 51 1.1 times larger than the base area S2 of the second plug 52, the current density in the second plug 52 is decreased by approximately 5% in comparison to a case that the base area S1 of the first plug 51 is equal to the base area S2 of the second plug 52. In addition, the current density in the first plug 51 is also decreased.

EM lifetime which is a time period until a semiconductor device is broken due to EM is generally represented by the following Black expression:

$$t50 = A \times 1/J^n \times \exp(Ea/kT)$$

where the parameter "t50" represents a time period at which a failure rate is 50% (failure time); the parameter "A" represents a constant; the parameter "J" represents a current density; the parameter "n" represents a current density index; the parameter "Ea" represents an activation energy; the parameter "k" represents a Boltzmann constant; and the parameter "T" represents an absolute temperature.

Generally, the current density index n of an interconnect mainly formed of copper is approximately 1.0. That is, the EM lifetime can be extended approximately as much as the current density is decreased. Hence, if the line width W1 of the first interconnect 31 is narrower than the line width W2 of the second interconnect 32, the base area of the first plug 51 is made larger than that of the second plug 52 by 10%, and thereby extending the EM lifetime at least by 5%. As described above, even if RM1'+RV1 is not equal to RM2'+RV2, the base area of the first plug 51 is made larger than that of the second plug 52, and thereby obtaining an effect to improve the EM resistance.

FIGS. 3(a) and 3(b) illustrate the example in which the first interconnect 31 having the narrower line width is formed in the lower interconnect layer 21, and the second interconnect 32 having the wider line width is formed in the upper interconnect layer 22. However, as illustrated in FIGS. 5(a) and 5(b), even if the first interconnect 31 having the narrower line width is formed in the upper interconnect layer 22, and the second interconnect 32 having the wider line width is formed in the lower interconnect layer 21, the current concentration on one of the plugs can be reduced. The first and second plugs 51 and 52 are integrally formed with the first interconnect 31. In this case, the first plug 51 having the larger base area may be formed on the end side of the first interconnect 31 with respect to the second plug 52.

The first and second interconnects 31 and 32 may extend in the same direction so as to overlap one above the other in the region where the plugs are formed, and the entire interconnects do not necessarily extend in the same direction. Hence, by providing a bent portion in the first interconnect 31 as illustrated in FIGS. 6(a) and 6(b), interconnects extending in different directions can be connected to each other as long as the region is formed, where the first and second interconnects 31 and 32 extend in the same direction so as to overlap one above the other. FIGS. 6(a) and 6(b) illustrate the example in which the first interconnect 31 is formed below the second interconnect 32, but the first interconnect 31 may be formed above the second interconnect 32. In addition, the first interconnect 31 has the bent portion. However, the second interconnect 32 may have the bent portion, or both interconnects may have the bent portions.

Figure 7:
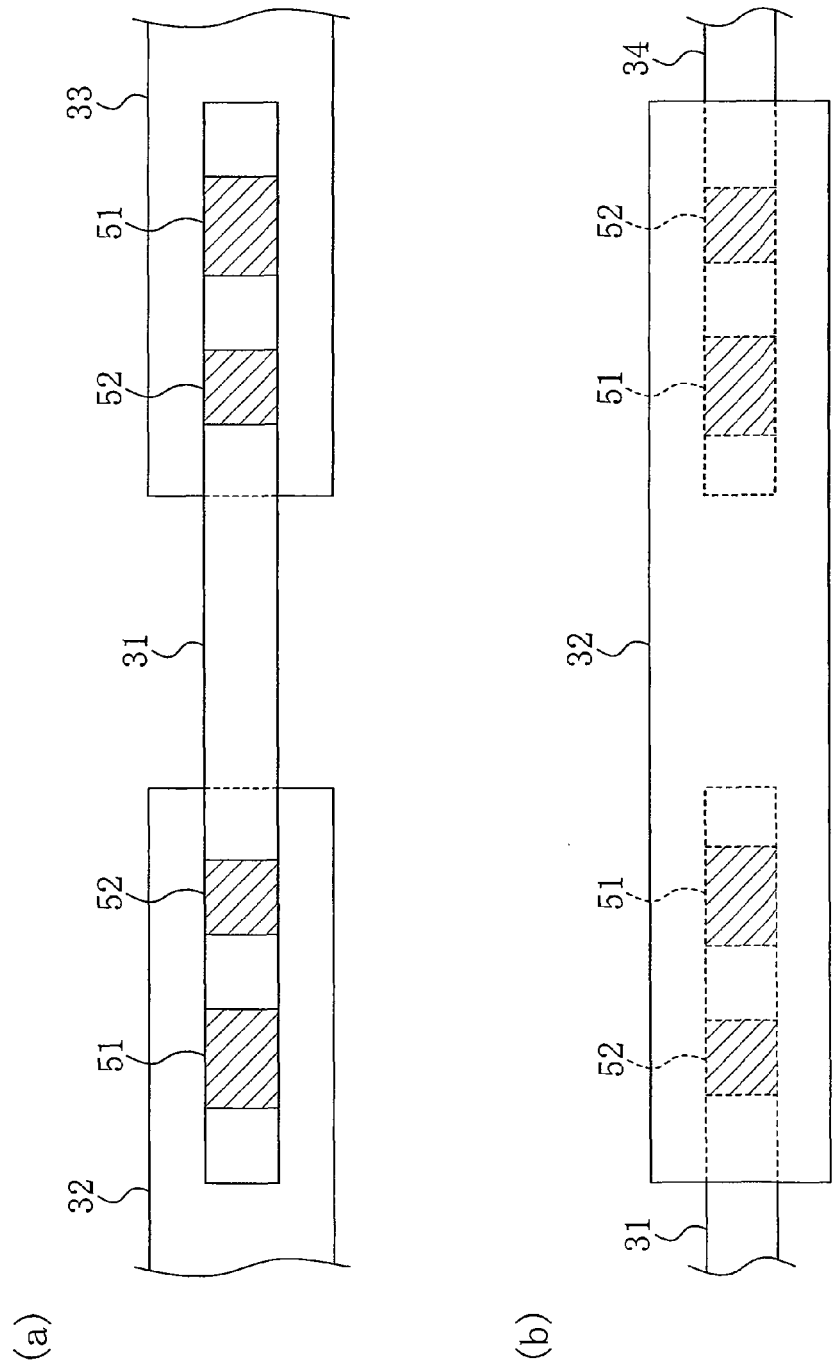
FIGS. 7(a) and 7(b) are plan views illustrating a variation of the semiconductor device of the one embodiment.

FIG. 7(a) illustrates an example in which the first interconnect 31 is a connecting interconnect for connecting between the second interconnect 32 and a third interconnect 33. In this case, the first and second plugs 51 and 52 may be formed in proximity to both ends of the first interconnect 31, respectively. In addition, as illustrated in FIG. 7(b), the second interconnect 32 may be a connecting interconnect for connecting between the first interconnect 31 and a fourth interconnect 34. In this case, each of the first and fourth interconnects 31 and 34 may be formed with the first and second plugs 51 and 52 so that the first plug 51 is formed on the end side of the interconnect. Either of the first and second interconnects 31 and 32 can be formed in the upper interconnect layer. In addition, the second and third interconnects 32 and 33, and the first and fourth interconnects 31 and 34 are not necessarily formed in the same interconnect layer.

In the present embodiment, two plugs connecting between the first and second interconnects 31 and 32 have been described, but the number of plugs may be three or more. In this case, the first plug 51 which is formed on the end side of the first interconnect 31 having the narrower line width has the largest base area, and the base areas of the other plugs are successively reduced according to their locations. FIG. 8 illustrates an example in which the first plug 51; the second plug 52; and a third plug 53 which is formed between the first and second plugs 51 and 52, and which has a base area smaller than that of the first plug 51, and larger than that of the second plug 52, are formed. In this case, a relationship among the lengths may be represented by, e.g., an expression c1>c3>c2. In addition, more than two plugs may be formed between the first and second plugs 51 and 52.

In the present embodiment, the first and second plugs, the planar shape of which is rectangular, have been described. However, the planar shape may be any shapes such as round and ellipsoidal shapes.

The first and second interconnects which are made of copper, and which are formed by the dual damascene process have been described. However, the present disclosure is not limited to such a configuration, but may be applicable to the interconnects and the plugs which are formed with different materials, such as two aluminum interconnects connected by tungsten plugs. Consequently, the EM resistance can be similarly improved. Even if the interconnects and the plugs are formed with the same material, a movement of atoms due to EM may be obstructed at an interface between the interconnect and the plug. Hence, even in the case that the interconnects and the plugs are formed with the same material, an effect to improve the EM resistance can be obtained.

The semiconductor device of the present disclosure is useful as a semiconductor device, etc. including a plurality of interconnects electrically connected to each other by plugs, in which a current flowing in the plugs connecting between an interconnect of an upper layer and an interconnect of a lower layer is effectively dispersed, and thereby realizing the semiconductor device having an excellent electromigration resistance.

What is claimed is:
1. A semiconductor device, comprising:
a first interconnect;

a second interconnect which is formed in a different interconnect layer from that of the first interconnect, and which has a wider line width than that of the first interconnect; and first and second plugs which are formed in a region where the first and second interconnects extend in the same direction so as to overlap one above the other, and which electrically connect the first and second interconnects, wherein the first plug has a larger base area than that of the second plug, and is formed on an end side of the first interconnect with respect to the second plug, and the first interconnect has greater resistivity than that of the second interconnect.

2. The semiconductor device of claim 1, wherein
a base shape of the first plug is square or round, and
a base shape of the second plug is rectangular or ellipsoidal.

3. The semiconductor device of claim 1, wherein the first plug has a length extending in a direction intersecting with the line width of the first interconnect, which is longer than that of the second plug.

4. The semiconductor device of claim 3, wherein the first and second plugs have widths extending in a direction parallel to the line width of the first interconnect, which are equal to the line width of the first interconnect.

5. The semiconductor device of claim 1, wherein a region where the first and second plugs are formed includes an end of the first interconnect.

6. The semiconductor device of claim 1, further comprising:
a third plug which electrically connects the first and second interconnects, which is formed between the first and second plugs, and which has a base area smaller than that of the first plug, and larger than that of the second plug.

7. A semiconductor device, comprising:
a first interconnect;
a second interconnect which is formed in a different interconnect layer from that of the first interconnect, and which has a wider line width than that of the first interconnect; and first and second plugs which are formed in a region where the first and second interconnects extend in the same direction so as to overlap one above the other, and which electrically connect the first and second interconnects, wherein the first plug has a larger base area than that of the second plug, and is formed on an end side of the first interconnect with respect to the second plug, and a sum of a resistance value between the first and second plugs in the first interconnect, and a resistance value of the first plug is equal to a sum of a resistance value between the first and second plugs in the second interconnect, and a resistance value of the second plug.

8. The semiconductor device of claim 7, wherein
a base shape of the first plug is square or round, and
a base shape of the second plug is rectangular or ellipsoidal.

9. The semiconductor device of claim 7, wherein the first plug has a length extending in a direction intersecting with the line width of the first interconnect, which is longer than that of the second plug.

10. The semiconductor device of claim 9, wherein the first and second plugs have widths extending in a direction parallel to the line width of the first interconnect, which are equal to the line width of the first interconnect.

11. The semiconductor device of claim 7, wherein a region where the first and second plugs are formed includes an end of the first interconnect.

12. The semiconductor device of claim 7, further comprising:
a third plug which electrically connects the first and second interconnects, which is formed between the first and second plugs, and which has a base area smaller than that of the first plug, and larger than that of the second plug.

13. A semiconductor device, comprising:
a first interconnect;
a second interconnect which is formed in a different interconnect layer from that of the first interconnect, and which has a wider line width than that of the first interconnect; and first and second plugs which are formed in a region where the first and second interconnects extend in the same direction so as to overlap one above the other, and which electrically connect the first and second interconnects, wherein the first plug has a larger base area than that of the second plug, and is formed on an end side of the first interconnect with respect to the second plug, the second interconnect is formed in an upper interconnect layer with respect to the first interconnect, the first and second interconnects are copper interconnects having conductive barrier films, and the first and second plugs are integrally formed with the second interconnect.

14. The semiconductor device of claim 13, wherein
a base shape of the first plug is square or round, and
a base shape of the second plug is rectangular or ellipsoidal.

15. The semiconductor device of claim 13, wherein the first plug has a length extending in a direction intersecting with the line width of the first interconnect, which is longer than that of the second plug.

16. The semiconductor device of claim 15, wherein the first and second plugs have widths extending in a direction parallel to the line width of the first interconnect, which are equal to the line width of the first interconnect.

17. The semiconductor device of claim 13, wherein a region where the first and second plugs are formed includes an end of the first interconnect.

18. The semiconductor device of claim 13, further comprising:
a third plug which electrically connects the first and second interconnects, which is formed between the first and second plugs, and which has a base area smaller than that of the first plug, and larger than that of the second plug.

* * * * *